US008954820B2

(12) United States Patent
Nemati Anaraki et al.

(10) Patent No.: US 8,954,820 B2
(45) Date of Patent: Feb. 10, 2015

(54) REDUCED COMPLEXITY NON-BINARY LDPC DECODING ALGORITHM

(71) Applicant: STEC, Inc., Santa Ana, CA (US)

(72) Inventors: Majid Nemati Anaraki, Irvine, CA (US); Xinde Hu, San Diego, CA (US); Richard D. Barndt, San Diego, CA (US)

(73) Assignee: STEC, Inc., Santa Ana, CA (US)

( * ) Notice: Subject to any disclaimer, the term of this patent is extended or adjusted under 35 U.S.C. 154(b) by 80 days.

(21) Appl. No.: 13/764,649

(22) Filed: Feb. 11, 2013

(65) Prior Publication Data

US 2013/0212451 A1 Aug. 15, 2013

Related U.S. Application Data

(60) Provisional application No. 61/597,690, filed on Feb. 10, 2012.

(51) Int. Cl.
| | | |
|---|---|---|
| *H03M 13/00* | (2006.01) | |
| *H03M 13/05* | (2006.01) | |
| *H03M 13/11* | (2006.01) | |
| *H03M 13/25* | (2006.01) | |

(52) U.S. Cl.
CPC .......... *H03M 13/05* (2013.01); *H03M 13/1111* (2013.01); *H03M 13/1122* (2013.01); *H03M 13/114* (2013.01); *H03M 13/1171* (2013.01); *H03M 13/6505* (2013.01); *H03M 13/1162* (2013.01); *H03M 13/255* (2013.01)
USPC ........... 714/758; 714/773; 714/780; 714/794; 714/799

(58) Field of Classification Search
CPC ................... H03M 13/1171; H03M 13/1111; H03M 13/1162; H03M 13/255
See application file for complete search history.

(56) References Cited

U.S. PATENT DOCUMENTS

| | | | | |
|---|---|---|---|---|
| 7,856,593 | B2 * | 12/2010 | Xin ............................... | 714/807 |
| 2005/0283707 | A1 * | 12/2005 | Sharon et al. .................. | 714/758 |
| 2006/0026486 | A1 * | 2/2006 | Richardson et al. .......... | 714/758 |
| 2008/0172592 | A1 * | 7/2008 | Wehn et al. ................... | 714/758 |
| 2011/0078548 | A1 * | 3/2011 | Xin ............................... | 714/807 |

(Continued)

OTHER PUBLICATIONS

Declercq, et al., "Decoding Algorithms for Nonbinary LDPC Codes over GF(q)," IEEE Trans. on Commun., Apr. 2007, vol. 55(4), pp. 633-643.

(Continued)

*Primary Examiner* — John Trimmings
(74) *Attorney, Agent, or Firm* — McDermott Will & Emery LLP

(57) ABSTRACT

A custom decoding algorithm is introduced, in connection with a corresponding decoding structure, to resolve many complexity and large memory requirements of known decoders. A system. A variable node forms a confidence vector of four components, one component for each state of a memory cell, and passes the current primary component (e.g., the largest) to one or more check nodes. The check nodes calculate a temporary component and corresponding index based on all components received from the variable nodes, which they pass back to the respective variable nodes. The variable node updates the confidence vector based on the temporary nodes received from respective check nodes, and determines the correct state for corresponding memory cell based on which component in the confidence vector is currently the primary component.

20 Claims, 10 Drawing Sheets

(56) References Cited

U.S. PATENT DOCUMENTS

2012/0110408 A1* 5/2012 Xin .............................. 714/752
2013/0132791 A1* 5/2013 Alrod et al. ................... 714/752

OTHER PUBLICATIONS

Declercq, et al., "Extended MinSum Algorithm for Decoding LDPC Codes over GF(q)," *Information Theory*, 2005. ISIT 2005.

Huang, et al., "Fast Min-Sum Algorithms for Decoding of LDPC over GF(q)," Proceedings of 2006 IEEE Inf. Theory Workshop, Sep. 2006, pp. 96-99.

Mansour, et al., "High-Throughput LDPC Decoders", IEEE Trans VLSI, Dec. 2003, vol. 11, pp. 976-996.

Ryan, et al., "Channel Codes, Classical and Modern", Cambridge University Press 2009, Chapter 14, pp. 592-635.

Song, et al., "Reduced-Complexity Decoding of Q-ary LDPC Codes for Magnetic Recording," IEEE Transactions on Magnetics, Mar. 2003, vol. 39, No. 2 pp. 1081-1087.

Sun, et al., "Multi-layer parallel decoding algorithm and Vlsi architecture for quasi-cyclic Ldpc Codes", Iscas, 2011, pp. 1776-1779, IEEE.

\* cited by examiner

REDUCED COMPLEXITY NON-BINARY LDPC DECODING ALGORITHM

CROSS-REFERENCES TO RELATED APPLICATIONS

This application claims priority from U.S. Provisional Application No. 61/597,690, filed Feb. 10, 2012, which is incorporated herein by reference in its entirety.

FIELD OF THE INVENTION

The subject technology generally relates to error correction codes in flash memory devices.

BACKGROUND

Decoder structures are often complex, computationally expensive and need large internal memory. Multi-level cell (MLC) flash memory cells increase the efficiency of flash memory devices by storing more bits in each cell. However, MLC technology affects the maximum usable endurance and retention of the flash memory. Therefore, design of efficient codes and decoders to achieve performance gain with relatively low complexity is desirable to increase the lifetime and/or performance of MLC-based flash memory devices.

SUMMARY

A decoding algorithm is disclosed herein, in connection with a corresponding decoding structure, to resolve many of the structural complexities and large memory requirements of known decoders. According to one aspect, a machine-readable storage medium may have non-transitory instructions thereon that, when executed, perform a method of decoding a codeword. Accordingly, the method may comprise providing a confidence vector at each of a plurality of variable nodes, each confidence vector associated with a portion of the codeword and comprising two or more vector components, at each variable node, selecting one of the vector components and passing the selected vector component to one or more of a plurality of check nodes, at each of the plurality of check nodes, calculating a return value for each variable node that passed a selected vector component to the check node, each respective return value calculated based on vector components received from variable nodes other than a variable node designated to receive the respective return value, receiving, at each variable node, a plurality of return values from the one or more check nodes, and updating, at each variable node, the confidence vector based the plurality of return values to indicate one or more values assigned to the portion of the codeword.

Passing the selected vector component to one or more of a plurality of check nodes may comprise passing an index of the selected vector component to the one or more check nodes. Moreover, at each check node, a return index may be calculated for the return value based on indices received from the variable nodes other than the variable node designated to receive the return value, and, for each check node, the return index may be returned with the return value to the designated variable node. Likewise, for each variable node, receiving the plurality of return values may comprise receiving a return index for each return value. In this regard, updating the confidence vector may comprise adding each return value to the confidence vector at a corresponding return index. Additionally or in the alternative, the return index may be calculated by summing the indices received from the other variable nodes using Galois field addition with a number of elements equal to the number of components in the confidence vector.

In another aspect, a method may comprise receiving, at a first variable node, a confidence vector comprising a number of confidence vector components equal to a number of possible states of a memory cell, an index of a primary one of the confidence vector components being representative of a current state of the memory cell, the memory cell configured to store one or more bits of a codeword, calculating a temporary vector component and corresponding component index for the first variable node based on other vector components and corresponding indices from one or more other variable nodes, updating the confidence vector based on the temporary vector component and corresponding component index and other vector components and corresponding indices, determining whether the index of the primary one of the confidence vector components has changed as a result of one or more of the calculating and updating steps, and, if the index has changed, changing the current state of the memory cell in accordance with the updated index.

If a further aspect, a system may include a plurality of memory cells configured to store a codeword, each memory cell configured to store one or more symbols (e.g., one or more bits) of a codeword, and a decoder comprising decoding logic representative of a plurality of variable nodes operably connected to a plurality of check nodes in a graph configuration, with each variable node associated with a corresponding memory cell. In this regard, the decoder may be configured to receive, at a first variable node, a confidence vector comprising a number of vector components equal to a number of possible states of a respective memory cell, an initial index of a primary one of the vector components being representative of a current state of the respective memory cell, transmit, from the first variable node to a first check node, the index of the primary vector component and a first value for the primary vector component, receive, at the first check node, other vector component values and corresponding indices from one or more other variable nodes, calculate a first return value and corresponding return index for the first variable node based on the other vector component values and corresponding indices, return the first return value and corresponding return index to the first variable node, update the confidence vector based on the first return value and corresponding return index and other return values and corresponding other indices received from other check nodes, determine whether a component at the initial index is a primary component, and, on determining that the component at the initial index is not a primary component, change the current state of the respective memory cell in accordance with a new index of the primary component.

These and other aspects may provide one or more advantages, including, but not limited to, providing an algorithm that does not need fast Fourier transform (FFT) computations, does not perform a search on candidate symbols (configuration sets), avoids FFT and search among configuration sets, and may only require selecting a max/min and summation/subtraction at each check/variable node. The messages passed between check nodes and variable nodes are not required to be full LLR vectors in methods discussed in existing literature. In the decoding algorithm of the subject technology, each message is made up of one LLR value (e.g., 10-12 bits) and one field element (e.g., n bits in n-bit low density parity check code (LDPC) codes). This reduces the required memory to store the messages between check and variable nodes to slightly more than one quarter of the memory required by other methods (e.g., in which message vectors for 2-bit LDPC have 4 dimensions, 12 bits each, and in which 3-bit LDPC have 8 dimensions, about 12 bits each). Therefore, a significant saving on memory size for code of large blocks may be achieved. Simulation results have illustrated that, despite a significant complexity and memory reduction, performance loss with respect to FFT based methods is reasonable, and the algorithm of the subject technology outperforms extended min-sum (EMS) algorithms and the equivalent binary LDPC codes.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

A detailed description will be made with reference to the accompanying drawings.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology may be practiced without these specific details. In some instances, structures and components are shown in block diagram form in order to avoid obscuring the concepts of the subject technology. Like components are labeled with identical element numbers for ease of understanding.

An extended min-sum (EMS) algorithm may show a significant performance loss for high code rates due, in part, to the need to over limit the configuration sets to make it implementable. Simulation results show EMS performance results are inferior to equivalent binary low density parity check code (LDPC) results for code rates as high as 0.8 to 0.9 and block lengths of 8 k-bits. On the other hand, methods based on Fast Fourier Transform (FFT) or Inverse FFT (IFFT) decoder structures are generally complicated to implement, often requiring FFT/IFFT pairs to be done at each iteration, and on all data vectors corresponding to every Tanner graph edge. FFT/IFFT pairs in a logarithmic domain are computationally expensive and prone to quantization/range limitations (overflow/underflow) when implemented in limited precision in hardware. Therefore, such a decoder becomes much more complex than the equivalent binary LDPC codes.

A second level of implementation complexity relates to high memory requirements in non-binary decoders. Corresponding to each edge in the Tanner graph, there is a vector of Q element LLR values ($Q=2^p$), where p=symbol size in bits. These LLR values (e.g., 12-14 bits each) may be stored and passed along iterations, requiring such decoders to implement a large amount of memory. A third level of complexity in non-binary LDPC decoders may include the required permutation on the vector elements corresponding to each edge of the code tanner graph, resembling multiplication to H matrix elements.

A custom Min-Sum-Max (MSM) algorithm is described herein which provides a non-binary decoder having a complexity comparable to a binary LDPC decoder, and with reasonable performance loss, if any, compared to FFT-based decoders.

Figure 1:
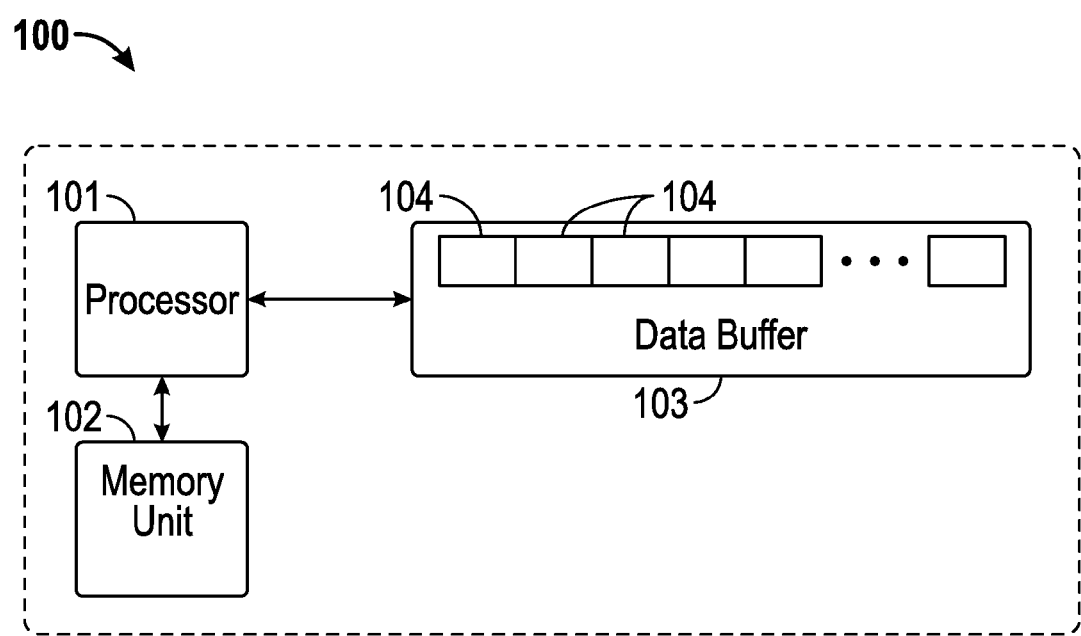
FIG. 1 depicts a low density parity check code (LDPC) decoding system for decoding one or more bits of a codeword.

FIG. 1 depicts a low density parity check code (LDPC) decoding system 100 for decoding one or more bits of a codeword, according to aspects of the subject technology. In decoding algorithms, messages are passed between variable nodes and check nodes (aka "constraint nodes") according to a code graph. In this regard, each variable node may include a confidence value for one or more bits of the codeword, the confidence value providing some indication as to whether these bits of the codeword are correct. In some aspects, each confidence value may represent a log-likelihood ratio (LLR) corresponding to one or more bits of a received codeword.

In low-density parity-check (LDPC) applications, a binary LLR may include the logarithm of a ratio between the probability of a bit being "0" or "1". A positive LLR may indicate that a signal read from the memory cell may likely be a 0-bit, and a negative LLR may indicate that the signal read from the memory cell may likely be a 1-bit. Each assigned LLR may correspond to a bit value of a codeword. In some examples, a bit value having an assigned LLR equal to five may be more likely to be a first predetermined value (e.g., a binary "0") than a bit value having an assigned LLR equal to a second predetermined value (e.g., a binary "1"). A bit value having an assigned LLR equal to zero may be equally likely to be either predetermined value. As will be described further, an LLR may also be represented by a non-binary "confidence vector" having a group of component values.

System 100 (e.g., implemented as a LDPC decoder) may include a processor 101, one or more memory units 102 (e.g., memory banks, flash memory chips, or the like), and a data buffer 103. The bits of a codeword may be stored at an address of a memory unit 102, in one or more registers, or in a memory address of data buffer 103. Confidence vectors for one or more portions of the codeword may be stored at one or more respective buffer locations 104 of data buffer 103, with each buffer location 104 providing memory space for a variable node. Each confidence vector (as opposed to a binary LLR) has a number of components, with the value of each component providing the possibility for an individual state of a memory cell. One of the components may be assigned a value of zero, and the other components of the confidence vector may be assigned values relative to zero.

The decoding process of the subject technology includes a process of updating confidence vectors stored at the variable nodes from other confidence vectors (e.g., using a min-sum decoding technique). Data buffer 103 may be configured as a temporary storage for a number of confidence values processed at any one time, with each buffer location 104 of data buffer 103 temporarily storing one confidence value (e.g., as a series of bits). Each stored confidence value may represent a level of certainty that the raw bit value corresponding to the confidence value is what it purports to be. Decoding system 100 may use a parity-check matrix to generate and/or update component values of the stored confidence vectors in data buffer 103 during a decoding of the received codeword. Not all bit values of a received codeword may be decoded simultaneously, but, rather the bit values may be decoded based on a parity check equation generated from a processed row of the parity-check matrix.

In multi-level cell (MLC) flash memory applications, non-binary LDPC codes may be more compatible with the nature of the stored signals in each cell. For example, 2-bit LDPC codes are a natural fit to MLC flash memory chips, and 3 bit LDPC codes are a natural fit to TLC flash memory chips, whether hard output signals or soft output signals are being used. On the other hand, for the same binary block length, an efficient non-binary decoder may be able to save required decoder memory, since for the same code rate, the number of nodes may be divided by $2^{q-1}$, compared to binary decoder using Q-ary LDPC where $Q=2^p$, and where p=symbols size in bits.

According to various aspects of the subject technology, a codeword may be stored in MLC flash memory. For example, a codeword may be received by system 100 and stored in a group of memory cells, with each memory cell storing one or more bits of the codeword. Each memory cell stores a symbol representative of a current state of a memory cell. For example, in a two bit MLC cell, each symbol represents a value in the set $\{0, 1, 2, 3\}$, which further represents two bits of a codeword (binary 00, 01, 10, 11). If a length of the codeword is 8000 bits then the codeword may be represented by 4000 symbols.

Additionally, each confidence vector may be represented by a vector having a size (e.g., measured in number of components) equal to the number of possible values for each symbol. For example, if the symbol has four positions $\{0, 1, 2, 3\}$ then the confidence vector may have four vector components, $V=<v_1, v_2, v_3, v_4>$. It is noted that the confidence vector may be of any size that represents a codeword symbol, and it is not necessary that one component is representative of one symbol or vice versa.

Decoding system 100 includes decoding logic (e.g., as an algorithm stored in memory unit 102) representative of a plurality of variable nodes connected to a plurality of check nodes in a graph configuration. Each buffer location 104 of data buffer 103 may include or be associated with a variable node for storing each confidence vector associated with a symbol of the codeword. The decoding logic may, for each variable node, select one of the vector components of a confidence vector and transmit the selected vector component and a corresponding field element (e.g., an index of the component) to one or more of a plurality of check nodes in accordance with the code graph. Each of the check nodes in the graph calculates a respective return value for each variable node that transmitted a selected vector component to the check node. In this regard, the return value calculated is based on vector components received from variable nodes connected to the check node along an edge of the code graph. In one aspect, the return value is calculated based on vector components received from variable nodes other than a variable node designated to receive the return value from the check node. Each variable node then receives a group of return values and corresponding field elements from the check nodes connected to the variable node along an edge of the code graph, and updates the confidence vector based the plurality of return values.

According to various aspects of the subject technology, check nodes only receive one component of a confidence vector from each variable node, and an index of that component. A check node may then calculate a return value based on a group of single components and indices received from the variable nodes. Therefore, instead of saving all vector components for variable nodes and check nodes for every edge in the code graph, only one component and one index may be saved and passed along each edge of the code graph (e.g., in each direction) during the iterative decoding process. In this regard, the decoding process considerably reduces the check node process (e.g., avoids FFT/IFFT or search process) and the amount of required memory. The decoding process reduces the number of possible errors to only one error per memory cell (e.g., as opposed to two errors for each memory cell).

The decoding process is iterative, and the confidence vector is updated with each iteration of the decoding process until the codeword has been decoded. During the process, the components of each confidence vector may change. For example, a variable node associated with the 2000th symbol of the codeword ($vn_{i=2000}$) may initially hold a confidence vector $V=<1, 3, 8, 2>$. The decoder may calibrate V by selecting an index of the component vector, reducing the component at that index to zero, while reducing other components within the confidence vector by a similar amount. For example, $V=<1, 3, 8, 2>$ is calibrated to become $V'=<0, 2, 7, 1>$. In other aspects, the decoder may calibrate V by a normalization process (e.g., based on 1) such that $V=<0.1, 0.3, 0.8, 0.2>$.

The component having the highest value may then be selected as the primary component of the confidence vector, such that the index of the primary component is representative of the symbol value. For example, where $V=<0, 2, 7, 1>$, the third index (with the highest value of "7") determines the state of the memory cell, in this example, equivalent to a binary "10" (e.g., $i_2$ of $\{00, 01, 10, 11\}$). With each iteration, if the symbol is correct then the value of the third index ($i_2$) will converge to infinity, while the values of the other indices of the confidence vector converge to zero or negative infinity (e.g., the log of zero). If the index of the primary component changes, and converges to infinity then the symbol is incorrect. In that case, the codeword will contain at a location corresponding to the variable node a new symbol associated with the new index of the primary component. For example, if $V'=<0, 7, 2, 1>$ then the symbol is determined to be in the second state, indicating a binary "01". It is understood that during the decoding process a symbol need not be associated with a binary value with each iteration, but, rather, symbols may be converted to binary values at the completion of the decoding process (e.g., after all component values for all variable nodes have converged).

Figure 2:
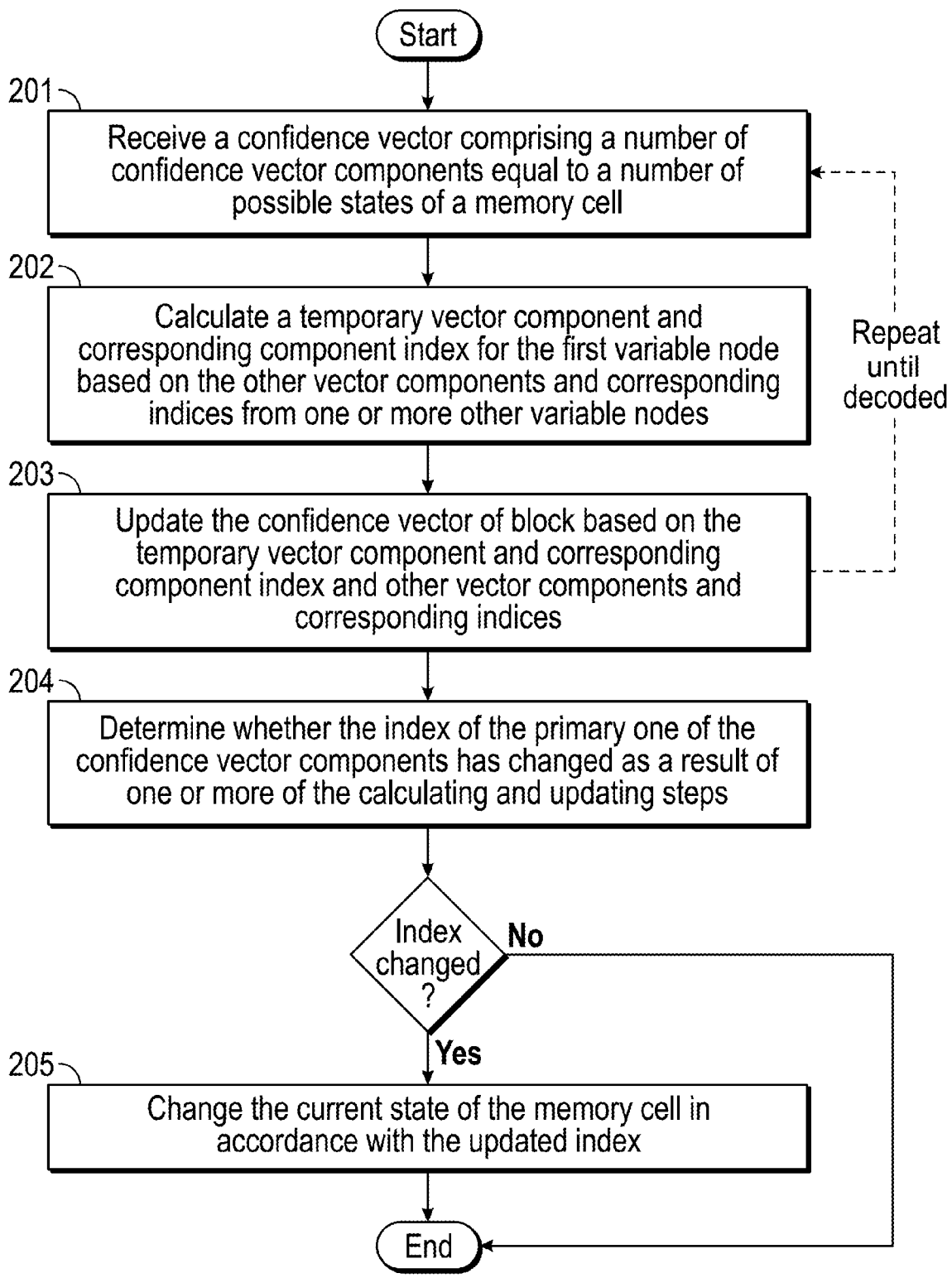
FIG. 2 is a flowchart illustrating an example process for decoding a codeword.

FIG. 2 is a flowchart illustrating an example process for decoding a codeword. According to some aspects, one or more blocks of FIG. 2 may be executed by a decoding algorithm implemented by a decoder in connection with decoding hardware, a processor (e.g., a microprocessor), and/or software. The decoder, together with the algorithm, is configured to decode codewords stored in a plurality of memory cells, with each memory cell being configured to store one or more bits of the codeword. Similarly, a non-transitory machine-readable medium may include machine-executable instructions thereon that, when executed by a computer, machine, or processor, perform the blocks of FIG. 2.

In block 201, a confidence vector comprising a number of confidence vector components (e.g., numerical values) equal to a number of possible states of a memory cell is received at a first variable node (e.g., at a buffer location 104 of data buffer 103). In some aspects, an index of a primary one of the confidence vector components is representative of a current state of the memory cell.

In block 202, a temporary vector component and corresponding component index for the first variable node is calculated based on other vector components and corresponding indices from one or more other variable nodes. In some aspects, the calculation may be performed in connection with passing messages between a plurality of variable nodes and a plurality of check nodes. Accordingly, at each variable node, one of the vector components is selected and passed to the one or more of a plurality of check nodes, and the calculation is performed at each check node. Each check nodes calculates the temporary vector component in the form of a return value for each variable node that passed a selected vector component to the check node. In this regard, each respective return value is calculated based on vector components received from variable nodes other than a variable node designated to receive the respective return value. The return values are then returned by the check nodes to each variable node.

As will be described with reference to further example implementations, the temporary vector component and corresponding component index may be calculated using a number of different variations of the algorithm of the subject technology. For example, the temporary vector component may be calculated by summing the other vector components from the one or more other variable nodes operably connected to the check node performing the calculation. The temporary vector component may be calculated by selecting as the temporary vector component a smallest one or a largest one of the other vector components. In one example, at each check node, a first lowest value (e.g., having a lower value than all others) and a second (next) lowest value may initially be calculated from all vector components transmitted to the check node, and the first lowest value selected as a return value for all but one of the variable nodes that transmitted a selected vector component to the check node. The first lowest value would not be selected if that first lowest value originated from the variable node designated to receive the return value, but, rather, the second lowest value is selected as a return value for the that variable node. Alternatively, but in the same manner, each check node may calculate the first and second highest values as return values.

In some aspects, calculating the temporary vector component may include determining a difference between the primary one of the confidence vector components and a largest one of a group consisting of the primary one of the confidence vector components and the other vector components. Accordingly, if the largest of the vector components is the vector component received from the designated variable node then the return value may be zero.

With further reference to block 202, an index of the selected vector component is also passed to the one or more check nodes, and, at each check node, a return index is calculated for the return value based on indices received from the other variable nodes (not designated to receive return values. As will be described in further detail with reference to the example implementations, the corresponding component index may be calculated by summing the corresponding indices from one or more other variable nodes using Galois field (GF) addition with a number of elements equal to the number of vector components.

In block 203, the confidence vector of block 201 is updated based on the temporary vector component and corresponding component index and other vector components and corresponding indices calculated in block 202. In this regard, each variable node updates an associated confidence vector based the calculations performed at operably connected check nodes. The value of each temporary vector component received at a variable node is added at the component index corresponding to the temporary vector component to form a new confidence vector. The vector components of the confidence vector may then be calibrated by reducing (or adding to) each of the vector components by an amount sufficient to zero a component value at a predetermined index the confidence vector. For example, V=<1, 3, 8, 2> may be calibrated to become V'=<0, 2, 7, 1>.

In block 204, the confidence vector is analyzed to determine whether the index of the primary one of the confidence vector components has changed as a result of one or more of the calculating and updating steps. As described previously, the largest of the components in the confidence vector may be considered to be the primary component. The decoding process determines whether the largest of the components after the confidence vector has been updated is still at the same index. If the index is the same then the current state of the memory cell will remain unchanged. However, if the index has changed, block 205, the current state of the memory cell is changed in accordance with the updated index.

Blocks 201, 202, and 203 may be repeated until each of the components of the confidence vector converge to one of two predetermined levels. For example, when one component converges to infinity then that component may be considered to be determinative for an associated bit of the codeword. Block 204 may be performed at each iteration, or may be performed after one or more components have converged, or after a predetermined number of iterations.

The following example implementations are provided to further elaborate on the decoding process of FIG. 2, and variations thereof. The following examples are not intended to limit the scope of the subject technology, but, rather to illustrate mathematical calculations, concepts, and other details that may be associated with the decoding algorithm of the subject technology.

Figure 3:
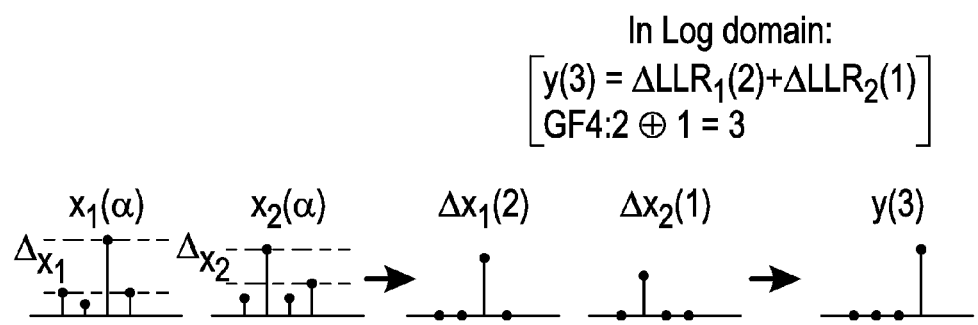
FIG. 3 depicts an example check node calculation process based on a pair of input vectors received from a pair of variable nodes.

FIG. 3 depicts an example check node calculation process based on a pair of input vectors received from a pair of variable nodes, according to one aspect of the subject technology. An example check node process may resemble a process of convolution, for example, implemented by a FFT method. In one aspect of the algorithm of the subject technology, however, LLR vectors may be modified (e.g., at the variable nodes and the check nodes) so that one delta LLR together with the index of a maximum LLR in the vector represents the vector.

In one example, check nodes need only the difference between a first maximum and a second maximum LLR's in each vector, and the field element (e.g., index) corresponding to the maximum LLR. Therefore, instead of saving and passing all vector elements from the check nodes to the variable nodes and vice versa, only one LLR value (e.g., a difference between two values processed by a check node) and one field element (e.g., 2 bits in GF-4 addition) may be saved and passed to the variable node during the iteration process. In this regard, the decoding process may considerably reduce mathematical overhead during the check node process (e.g., by avoiding FFT/IFFT, search process, or the like), and reduce the amount of required memory.

Accordingly, the left side of FIG. 3 depicts two confidence vectors, $x_1(\alpha)$ and $x_2(\alpha)$, provided at two respective variable nodes, wherein a designates the index of the maximum component of the vector. Each variable node determines a $\Delta x$ between a first maximum and a second maximum vector component for each of the confidence vectors and sends the result to one or more check nodes. The middle portion of FIG. 3 depicts check node addition of two vector components, $\Delta x_1(2)$ and $\Delta x_1(1)$. The right side of FIG. 3 depicts the addition of $\Delta x_1(2)$ and $\Delta x_1(1)$ as y(3) with $\alpha=3$ being the GF-4 addition of the index values of the two vector components.

Figure 4:
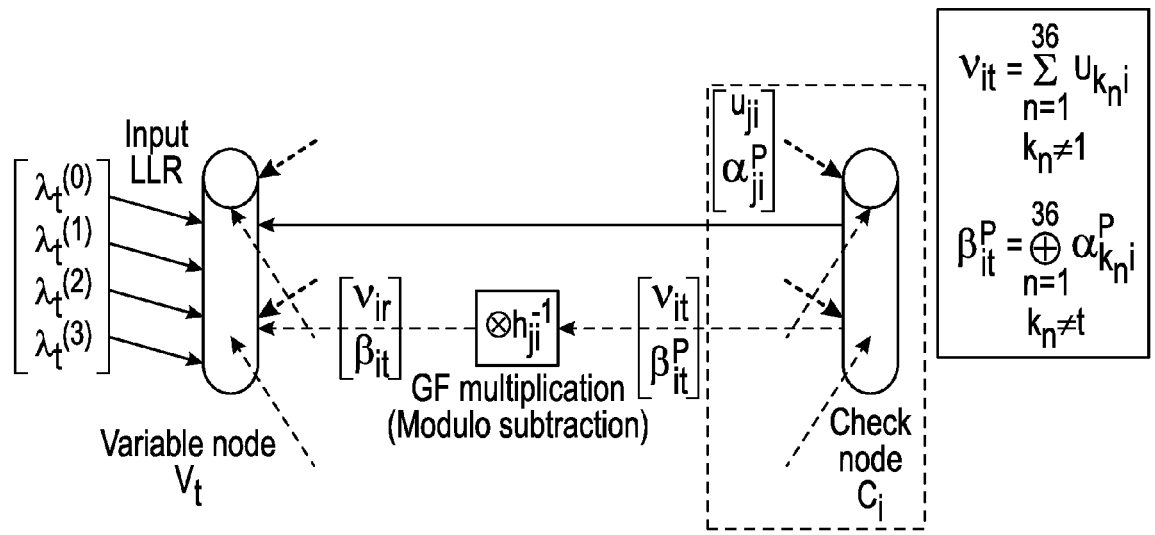
FIG. 4 depicts an example check node calculation process for 36 input vector edges.

FIG. 4 depicts an example check node calculation process for 36 input vector edges, according to one aspect of the subject technology. Each check node in this example code has 36 input vector edges. The messages from variable nodes to check nodes, and in the reverse direction are delta LLR's (as described before), together with field elements corresponding to maximum elements in LLR message vectors. The output LLR from each check node i to variable node t is the summation of all the incoming messages, except the message coming from variable node t.

In some aspects, the check to variable messages are calculated as below:

$$v_{it} = \sum_{\substack{n=1 \\ k_n \neq t}}^{36} u_{k_n i} \quad (1)$$

where $v_{it}$ is the LLR message from check node i to variable node t, and $u_{k_n i}$ is the LLR message from variable node $k_n$ to check node i. The corresponding field element in the message may be obtained from GF summation (XOR in the case of GF4) of all incoming field elements except the one coming from variable node t, the node that message may be sent to.

$$\beta_{it}^p = \bigoplus_{\substack{n=1 \\ k_n \neq t}}^{36} \alpha_{k_n i}^p \quad (2)$$

where $\beta_{it}^p$ and $\alpha_{k_n i}^p$ are the permuted values of $\beta_{it}$ and $\alpha_{k_n i}$ with elements of matrix H, respectively. Note that permutation is effectively a (modulo) summation of the message field element and corresponding H matrix element.

At the variable node, first, the incoming messages $v_{ij}$ may be added to the corresponding input LLR's $\lambda_j^{(a)}$. To do so, each incoming LLR may be added to a corresponding LLR element in the input LLR vector with similar field element $\beta_{ij}$. Therefore, the temporary vector $[\eta_{j|t}^{(0)} \, \eta_{j|t}^{(1)} \, \eta_{j|t}^{(2)} \, \eta_{j|t}^{(3)}]^t$ may be calculated as $$\eta_{j|t}^{(a)} \Big|_{a \in \{0,1,2,3\}} = \lambda_j^{(a)} + \sum_{\substack{k_n=1 \\ k_n \neq t \\ \beta_{k_n j}=a}}^{W_c} v_{k_n j} \quad (3)$$

where the vector $[\lambda_j^{(0)} \lambda_j^{(1)} \lambda_j^{(2)} \lambda_j^{(3)}]^t$ is the input LLR's (often normalized to the zero$^{th}$ element. i.e. $\lambda_j^{(0)}=0$.

The soft outputs may be calculated in the same way, with considering all the input messages to the node.

$$\eta_j^{(a)} \Big|_{a \in \{0,1,2,3\}} = \lambda_j^{(a)} + \sum_{\substack{k_n=1 \\ \beta_{k_n j}=a}}^{W_c} v_{k_n j} \quad (4)$$

where $[\eta_j^{(0)} \, \eta_j^{(1)} \, \eta_j^{(2)} \, \eta_j^{(3)}]^t$ is the soft output vector and $W_c$ is the column weight of the H matrix.

To make the notation more clear, (4) may be rewritten as $$\eta_j^{(a)} \Big|_{a \in \{0,1,2,3\}} = \lambda_j^{(a)} + \sum_{i=1}^{W_c} v_{k_i j} 1_{\{\beta_{k_i j}=a\}} \quad (5)$$

Figure 5:
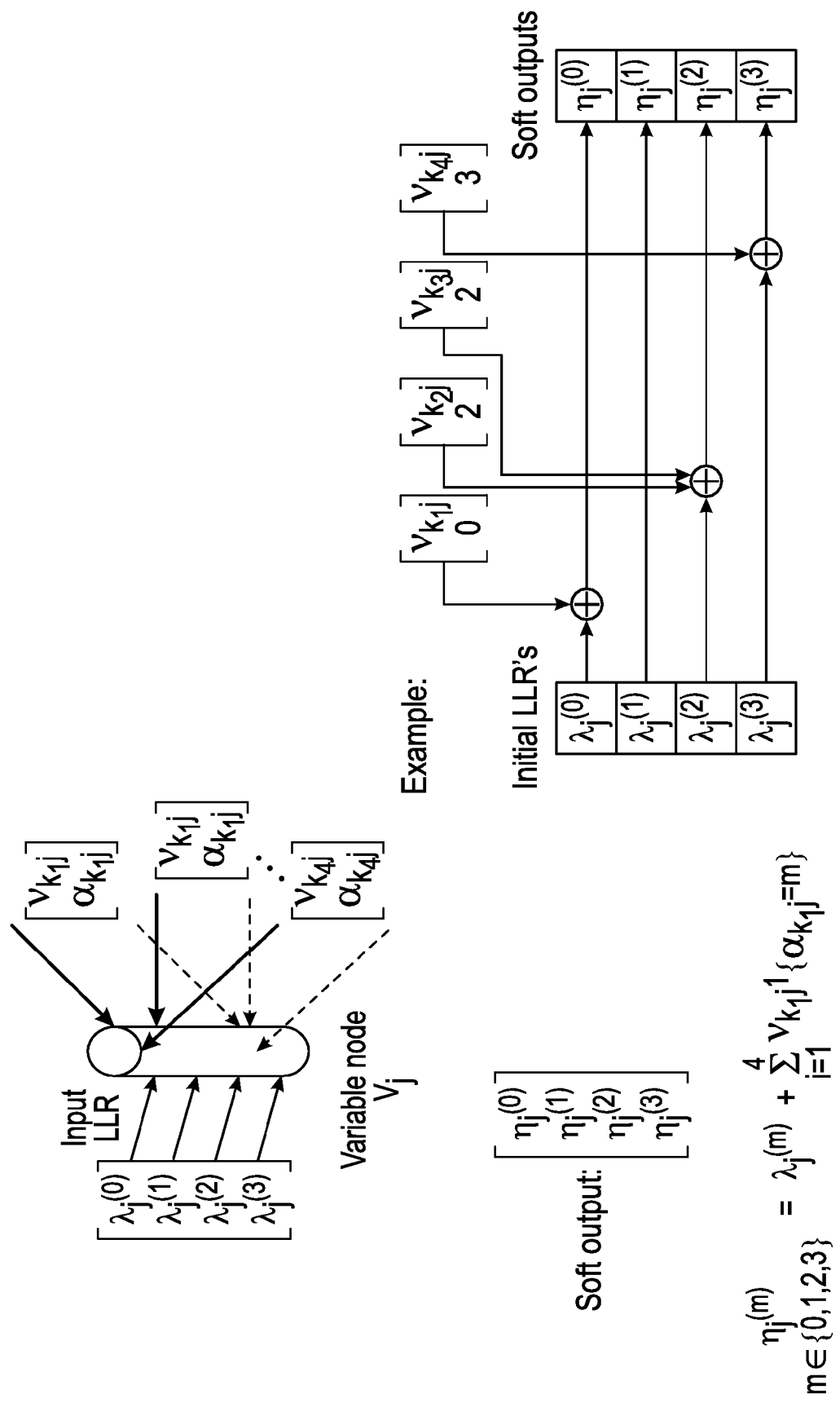
FIG. 5 depicts example temporary vector calculations and soft output for one or more check nodes.

FIG. 5 depicts example temporary vector calculations and soft output for one or more check nodes, according to one aspect of the subject technology. The variable messages $v_{jt}$, and corresponding index values $\alpha_{k_n j}$, that were previously calculated in FIG. 4 are returned to respective variable nodes $V_j$. Each variable node stores input LLRs and calculates a new temporary vector on each subsequent iteration based on temporary vector calculations by each check node. After a temporary vector is calculated at a variable node, the variable node messages to the check nodes may be calculated using the process as presented in FIG. 3. For example, the first and second maximum may be obtained and the output message may be the difference between these components, with the field element message being equal to the location of maximum element.

$$\alpha_{jt} = \operatorname*{argmax}_a \{\eta_{j|t}^{(a)}\} \quad (6)$$

$$\beta_{jt} = \operatorname*{argmax}_a \{\{\eta_{j|t}^{(a)}\} \setminus \alpha_{jt}\}$$

$$u_{jt} = \eta_{j|t}^{(\alpha_{jt})} - \eta_{j|t}^{(\beta_{jt})}$$

The two element vector messages may be denoted as $[u_{ji} \, \alpha_{jt}]^t$.

Figure 6:
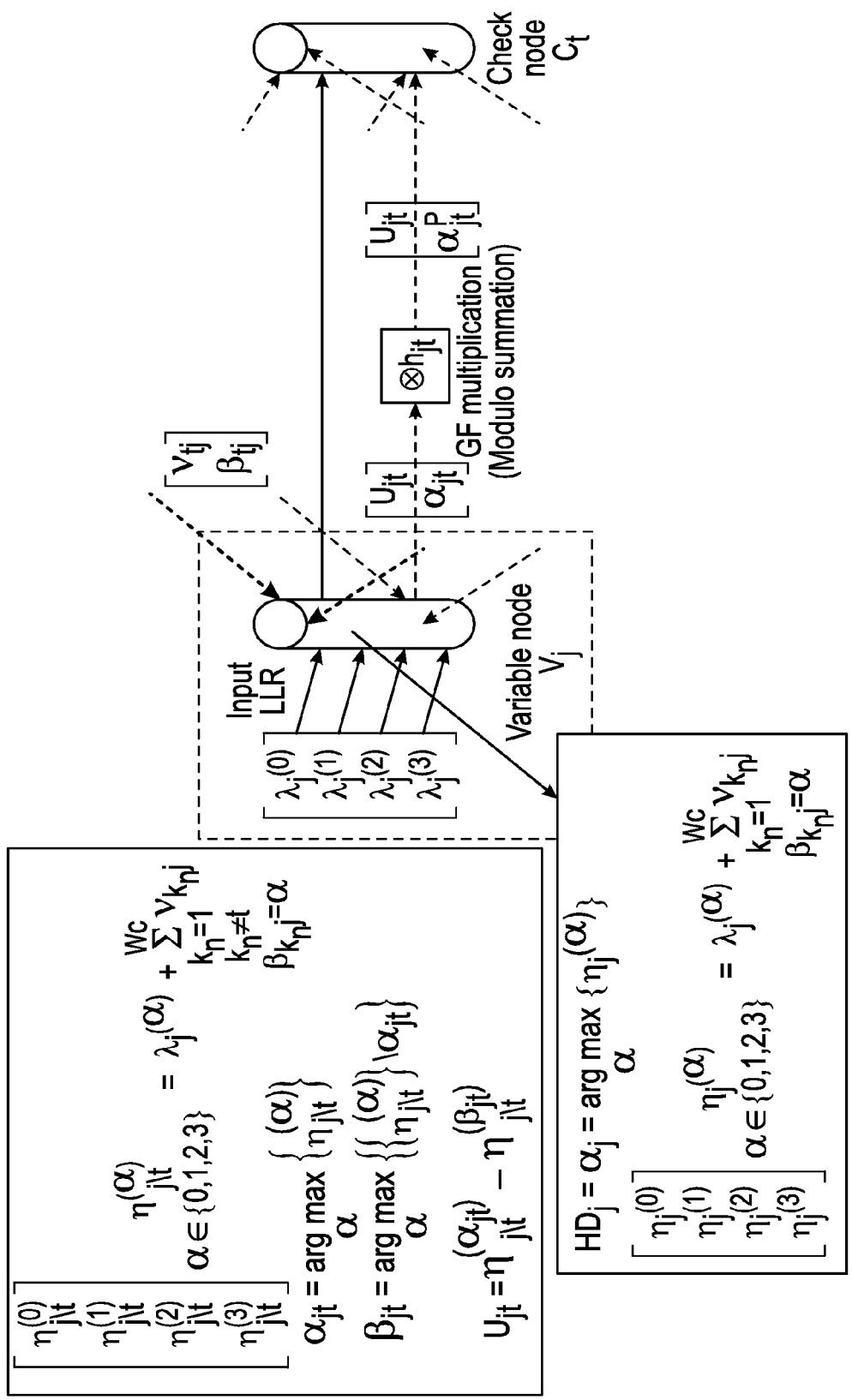
FIG. 6 depicts an example variable node calculation process.

FIG. 6 depicts an example variable node calculation process, according to one aspect of the subject technology. A permutation process may include non-zero H matrix elements. References corresponding to H matrix non-zero elements (e.g., the elements of the vector messages) may be permuted.

In one example, the second element of each message vector is the corresponding field element. This element may be multiplied (e.g, in the field) by one or more corresponding non-zero elements of H matrix. In GF-4, this is equivalent to modulo(4) summation of binary representation of H matrix entries and field elements of the vector messages, $$\alpha_{ji}^p = h_{ji} \otimes_{GF4} \alpha_{ji} \quad (7)$$

$$\alpha_{ji}^p = (h_{ji} + \alpha_{ji})_{Mod(4)} \quad (8)$$

When the messages are going in the reverse direction, for example, from check nodes to the variable nodes, the message field element may be divided by the H matrix element, equivalent to Modulo(4) subtraction of the binary representation of values.

Messages may tend to grow as the number of iterations increase, and may cause overflow in variables and cause poor outcomes. In order to resolve this issue, the check node process may be modified as follows.

Modified Method 1

Consider the check node t. The index t may be substituted in the following discussion for simplicity purposes. Define the variable U as the summation of all the input LLR's to this node.

$$U = \sum_{j=1}^{36} u_j = 36 u_{min} + \sum_{j=1}^{36} \Delta LLR_j \quad (9)$$

where $u_{min}$ is the minimum input LLR to the check node t and $\Delta LLR_j = u_j - u_{min}$. Therefore, $V_j$, the LLR value that may be passed to variable node j may be calculated as $$v_j = \sum_{\substack{i=1 \\ i \neq j}}^{36} u_i \quad (10)$$

$$= U - u_j$$

$$= 36 u_{min} + \sum_{i=1}^{36} \Delta LLR_i - (u_{min} + \Delta LLR_j)$$

$$= 35 u_{min} + \sum_{\substack{i=1 \\ i \neq j}}^{36} \Delta LLR_i$$

Since, in this example, $V_j$ is the summation of 35 LLR's in the check node, to prevent growing the messages as iteration increases, the average value may be used, for example, by dividing the resulted quantity by 35.

$$v_j = \frac{1}{35}\left(35 u_{min} + \sum_{\substack{i=1 \\ i \neq j}}^{36} \Delta LLR_i\right) = u_{min} + \frac{1}{35} \sum_{\substack{i=1 \\ i \neq j}}^{36} \Delta LLR_i \quad (11)$$

In one LLR estimate for $V_j$, the above equation may be approximated with a smaller value. To do so, the terms in the summation may be replaced with the smallest value among them. Therefore, if $u_k$ is the minimum input LLR to the check node and $k \neq j$, then $\Delta LLR_k = 0$ and all terms in the summation may be replaced by zero. If $k = j$, the minimum term in the summation is the difference between second minimum and the first minimum value, for example, min $\Delta LLR_i = u_{min2} - u_{min}$. Therefore, $$\hat{v}_j = u_{min} + \frac{1}{35}[35(u_{min2} - u_{min})] = u_{min2} \quad (12)$$

In summary, this method needs only the first and second minimum LLR values into each check node. The output LLR may be minimum input for all the edges except the one corresponding to minimum input. For that edge, the output may be equal to the second min, $u_{min2}$.

$$\hat{v}_j = \begin{cases} u_{min}; & u_j \neq u_{min} \\ u_{min2}; & u_j = u_{min} \end{cases} \quad (13)$$

Modified Method 2

A second method for preventing catastrophic growth of messages may include subtracting the minimum value of $V_j$ from all $V_j$'s going out from a check node. In this way, all outgoing LLR's may be shifted down as much as possible such that none of them becomes negative. The newly generated LLR to variable node j may be denoted as $\hat{v}_j$ $$\hat{v}_j = v_j - \min_{i \in \{1,2,\ldots,36\}} (v_i) \quad (14)$$

$$= v_j - \left(V - \max_{i \in \{1,2,\ldots,36\}} (u_i)\right)$$

$$= V - u_j - V + \max_{i \in \{1,2,\ldots,36\}} (u_i)$$

$$\hat{v}_j = \max_{i \in \{1,2,\ldots,36\}} (u_i) - u_j$$

According to this method, the maximum input to each check node is found, and the output of each edge may be the difference between the maximum input and the input of that edge.

Modified Method 3

One method may include the combination of the first and second modified methods. One result of simplifications in methods 1 and 2 was that only the maximum or the first two minimum values (e.g., instead of all 35 inputs) may be used to calculate the check node outputs. Methods 1 and 2 may be combined and therefore the information used in both min and max values.

$$v_j = k_1 \hat{v}_j + k_2 \hat{v}_j \quad (15)$$

$k_1$ and $k_2$ are coefficients that may be selected to prevent LLR catastrophic growth and lead to the best performance.

A second way of combining methods 1 and 2 is to use the following relation instead of (15)

$$v_j = (\hat{v}_j - v_0) + k_2 \hat{v}_j \quad (16)$$

where $v_0$ and $k_2$ are parameters that may be optimized.

To prevent negative values in $v_j$'s, one good value for $v_o$ may be a fraction of $v_{min}$, therefore, $$v_j = (\hat{v}_j - k_3 u_{min}) + k_2 \hat{v}_j \quad (17)$$

In some simulations, the best results were obtained by selecting $k_3 = 0.5$, $k_2 = 0.1$. In the section entitled "Finite Precision and Memory Requirements", these coefficients may be optimized regarding the utilized precision.

Other methods may be implement to improve performance.

Variable Node Modification

Theoretically, the previously explained approximation method may be modified to replace the two smallest probabilities in the vector by the second minimum value. This approximation may lead to a method that uses only the difference between the first and the second maximum LLR's. On the other hand, such an assumption may provide pessimistic probability, as the weaker 2 competitor symbols are considered as strong as the stronger competitor (e.g., second maximum).

It may be shown in practical conditions, when the third and fourth largest LLR's are increased (e.g., to further develop the disclosed custom MSM algorithm), the LLR difference between first and second largest LLR becomes smaller. In other words, the estimate obtained by one approximation (increasing $3^{rd}$ and $4^{th}$ LLR's) is a lower estimate. Therefore, to have a more realistic estimate, the LLR difference may be increased.

However, the amount of such an increase may depend on the particular values and may not be easy to calculate. Several values were simulated in a simulation platform to find the best value that on average works the best without complicated process. Simulation results show that the performance improves if the values in equation (6) are selected, as following.

$$\alpha_{jt}^1 = \underset{a}{\operatorname{argmax}}\{\eta_{jN}^{(a)}\} \quad (16)$$

$$\alpha_{jt}^2 = \underset{a}{\operatorname{argmax}}\{\eta_{jN}^{(a)}\} \setminus \alpha_{jt}^1$$

$$\alpha_{jt}^3 = \underset{a}{\operatorname{argmax}}\{\eta_{jN}^{(a)}\} \setminus \{\alpha_{jt}^1, \alpha_{jt}^2\}$$

$$\alpha_{jt}^4 = \underset{a}{\operatorname{argmax}}\{\eta_{jN}^{(a)}\} \setminus \{\alpha_{jt}^1, \alpha_{jt}^2, \alpha_{jt}^3\}$$

Therefore, $\alpha_{jt}^1 \geq \alpha_{jt}^2 \geq \alpha_{jt}^3 \geq \alpha_{jt}^4$. Then the updating equation may be (this choice may be optimized for the best performance):

$$u_{jt} = \left(\eta_{jN}^{(\alpha_{jt}^1)} - \eta_{jN}^{(\alpha_{jt}^2)}\right) + \left(\left(\eta_{jN}^{(\alpha_{jt}^1)} - \eta_{jN}^{(\alpha_{jt}^3)}\right) + \left(\eta_{jN}^{(\alpha_{jt}^1)} - \eta_{jN}^{(\alpha_{jt}^4)}\right)\right)/256 \quad (19)$$

$$= \left(\eta_{jN}^{(\alpha_{jt}^1)} - \eta_{jN}^{(\alpha_{jt}^2)}\right) + \left(\eta_{jN}^{(\alpha_{jt}^2)} + 3\eta_{jN}^{(\alpha_{jt}^1)} - \sum_{k=1}^{4}\eta_{jN}^{(\alpha_{jt}^k)}\right)/256$$

Soft Output Modification, Rewarding Method

A rewarding method may increase (reward) the soft output that corresponds to the hard symbol output at each iteration. In other words, the messages provided into a maximum soft output component may be enhanced by a factor of larger than 1, or by adding a positive value to them. In simulations for 2-bit LDPC, a factor of 1.25 resulted in an improved decoding performance.

Figure 7:
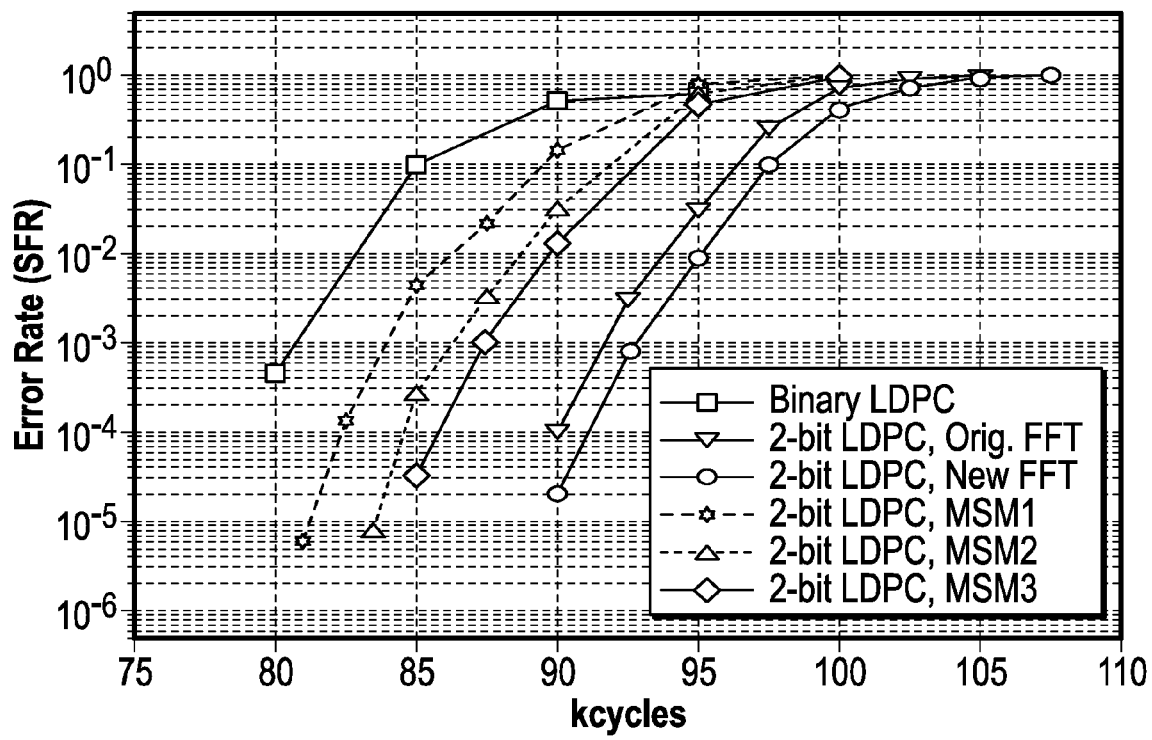
FIG. 7 depicts example simulation results of 2-bit LDPC custom MSM decoding algorithm in comparison with FFT-based algorithm.

FIG. 7 depicts example simulation results of a 2-bit LDPC custom MSM decoding algorithm in comparison with FFT-based algorithm, according to one aspect of the subject technology. FIG. 7 shows simulation results with various decoding algorithms. The results for MSM1 were obtained by selecting the proper minimum value (min1 or min2) in the check nodes. In the variable nodes, the method of the previously described Variable Node Modification was used. In MSM2, both the method of the previously described Variable Node Modification and Modified method 3 were used. Finally, by changing the coefficients of check and variable nodes, the MSM3 results were obtained.

Figure 8:
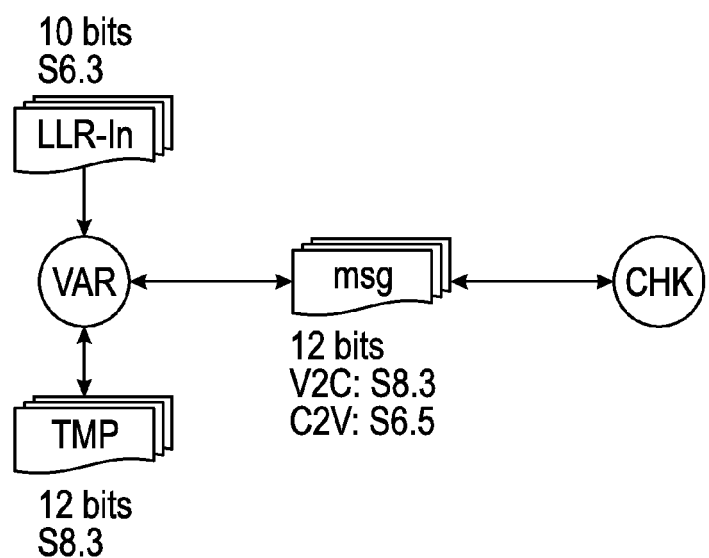
FIG. 8 depicts an example memory structure of a decoder.

FIG. 8 depicts an example memory structure of a decoder, according to one aspect of the subject technology. FIG. 8 shows an example memory structure of a custom MSM decoder for non-binary LDPC code, and associated memory precisons. For example, S6.3 represents a 10 bit memory including one sign bit, 6 bits as integer part and 3 bits for the fractional part. In order to simplify the precision requirements, some changes may be done to the previously described coefficients. In particular, the coefficients at equation (17) may be modified to $k_3=0.5$, $k_2=0.0938$ (note $0.0938=1/16+1/32$).

In the complexity analysis of 2-bit LDPC FFT-based decoder, in addition to complicated FFT/IFFT computation, the decoder may need a large amount of memory to pass the messages among iterations. As described previously, corresponding to each edge in the Tanner graph, 4 values may need to be saved and passed from variable to check nodes and vice versa. The decoding algorithm of the subject technology, however, provides a simplified method which does not need FFT/IFFT and saves considerably the amount of required memory, since there are only two values that need to be saved and passed among iterations per Tanner graph edge: the LLR value, and the corresponding field element (2 bits). Note that as a consequence of log-FFT and exponential/nonlinear transformations, a FFT-based method may be prone to quantization noise and overflow/underflow, therefore, a higher precision may be needed to avoid them. The custom MSM algorithm however, performs well with less precision in the number of bits.

As a comparison, in a sample code, the FFT-based method needed 184,704 bytes ($\rightarrow$150,144 bytes) memory as compared with 77,184 bytes ($\rightarrow$452,992 bytes). The modified values were obtained taking into account that v-node temporary memories may not be needed at the same time (as this is not a full parallel decoder). Therefore, memory may be shared, and, as a rough estimate, ⅛ of the original v-node memory was considered to calculate the modified required memory.

Figure 9:
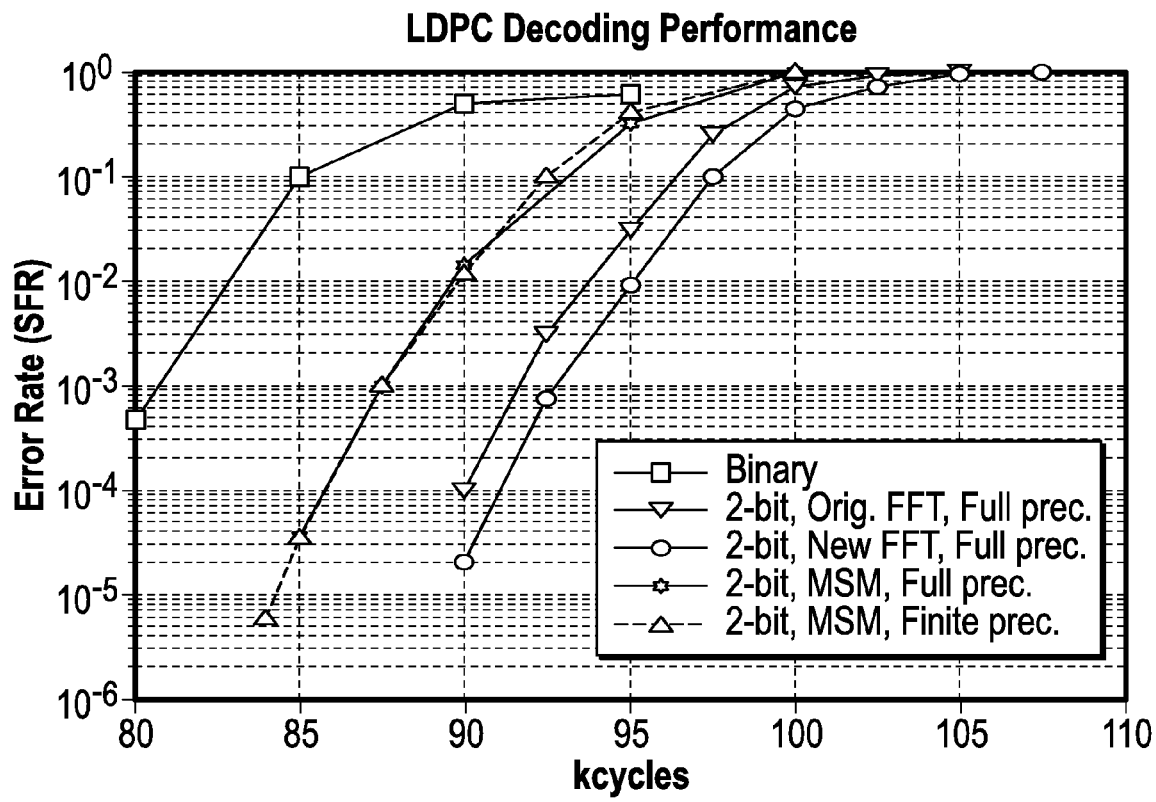
FIG. 9 depicts an example performance of a 2-bit LDPC custom MSM decoding algorithm with full/finite precision.

FIG. 9 depicts an example performance of a 2-bit LDPC custom MSM decoding algorithm with full/finite precision, according to one aspect of the subject technology. The results of full precision and finite precision of a decoder are plotted along with other decoding methods and binary LDPC for comparison. From the depicted graph, the performance loss of the algorithm due to finite precision may be negligible when precisions shown in FIG. 8 are used.

So far, the decoder may be adapted to include a flooding schedule, in which the updated information at each iteration may be used only in the next iteration. In contrast, a layered decoding structure allows the updated information to be utilized more quickly in the algorithm. See, for example, H. M. Mansour, N. R. Shanbhag, "High throughput LDPC decoders", IEEE Trans VLSI, vol. 11, pp 976-996, December 2003, and Y. Sun, G. Wang, J. R. Cavallaro, "Multi-layer parallel decoding algorithm and VLSI architecture for quasi-cyclic LDPC Codes", ISCAS, page 1776-1779, IEEE, 2011, incorporated herein in their entirety. A layered decoding algorithm may have a higher convergence speed (up to two times faster) and require less memory compared to standard two-phase flood scheduling algorithm.

Figure 10:
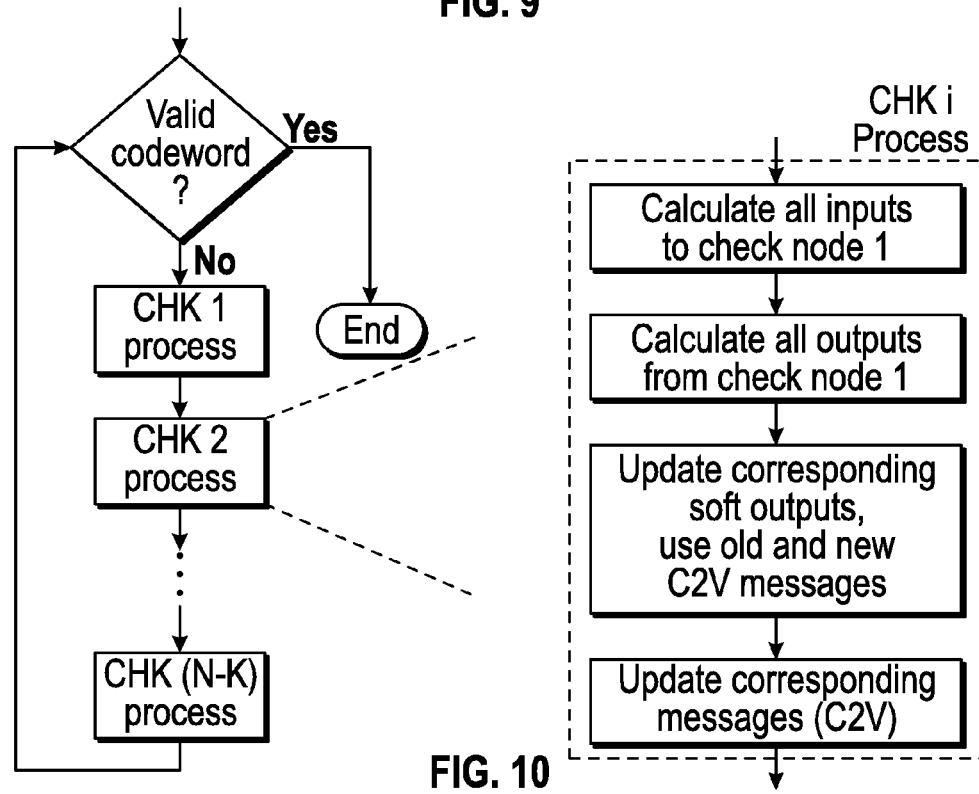
FIG. 10 depicts an example layered scheduling flowchart.

FIG. 10 depicts an example layered scheduling flowchart, according to one aspect of the subject technology. Layered scheduling assumes that rows are grouped into layers. The parity check matrix for a layer has at most a column weight of one. The number of layers in the hardware may be selected based on the required level of parallelism. For demonstration purposes, each row of the matrix is considered to be a layer. In this case, the check nodes start the process one after another (corresponding to rows of H) while they use the most recent updated information. Mathematically, for each column j with non-zero element in the current layer, the V2C messages may be updated as $$\eta_{j\setminus i}^{(\beta_{ij})} = \eta_j^{(\beta_{ij})} - V_{ij} \quad (20)$$

where $\eta_j^{(\beta_{ij})}$ is the $\beta_{ij}^{th}$ element of the soft values (soft values are vectors of four elements). Then as before, with $\alpha_{ji}^1 \geq \alpha_{ji}^2 \geq \alpha_{ji}^3 \geq \alpha_{ji}^4$, $$u_{ji} = \left[\left(\eta_{j,i}^{(\alpha_{ji}^1)} - \eta_{j,i}^{(\alpha_{ji}^2)}\right) + \left(\left(\eta_{j,i}^{(\alpha_{ji}^1)} - \eta_{j,i}^{(\alpha_{ji}^3)}\right) + \left(\eta_{j,i}^{(\alpha_{ji}^1)} - \eta_{j,i}^{(\alpha_{ji}^4)}\right)\right)\right]/128 - 0.6 \quad (21)$$

$$= \left[\left(\eta_{j,i}^{(\alpha_{ji}^1)} - \eta_{j,i}^{(\alpha_{ji}^2)}\right) + \left(\eta_{j,i}^{(\alpha_{ji}^2)} + 3\eta_{j,i}^{(\alpha_{ji}^1)} - \sum_{k=1}^{4}\eta_{j,i}^{(\alpha_{ji}^k)}\right)\right]/128 - 0.6$$

The updated V2C messages may be used at C-node i to generate new C2V messages.

$$v_j = (\hat{v}_j - k_3 v_{min}) + k_4 (u_{min2} - u_{min}) k_2 \hat{v}_j \quad (22)$$

where the optimum performance was obtained by selecting the coefficients as $$k_2 = \frac{1}{16}, k_3 = \frac{1}{2}, k_4 = \frac{1}{4}.$$

In this regard, FIG. 10 shows the process flow of layered LDPC decoding algorithm.

Also, a method similar to the previously described Soft Output Modification, Rewarding Method for flooding MSM was also applied in a layered MSM algorithm. However, the best performance was obtained with additive term of 0.0625. This constant value may be added to the soft values that correspond to the hard decisions at each iteration.

Figure 11:
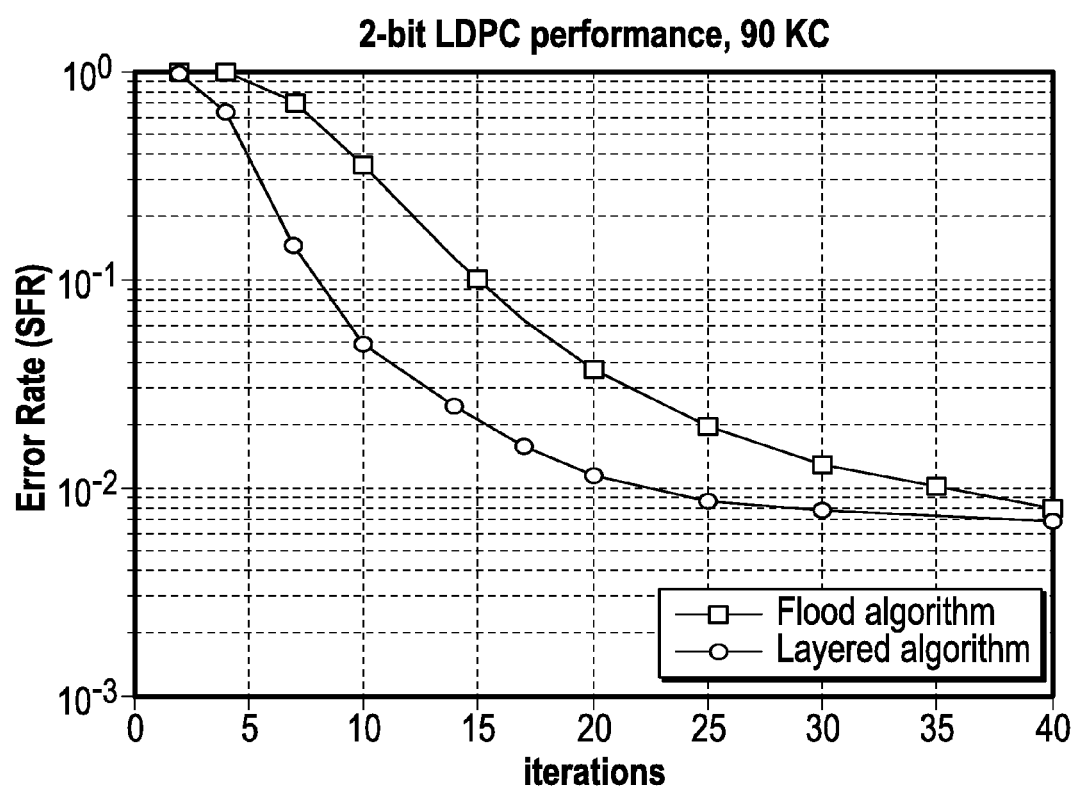
FIG. 11 depicts a chart demonstrating example performance results with respect to a number of iterations for layered MSM in comparison with flooded MSM.

FIG. 11 depicts a chart demonstrating example performance results with respect to a number of iterations for layered MSM in comparison with flooded MSM, according to one aspect of the subject technology. Performance simulation results with the explained configuration for layered MSM is shown in FIG. 11. In the depicted example, it may be seen that the final performance of both methods with a large number of iterations are approaching each other, however, the speed of convergence in layered MSM is up to two times faster than the flood MSM. Hence, with limited number of iterations (e.g., maximum 20 iterations) the layered MSM returns a better performance.

Figure 12A:
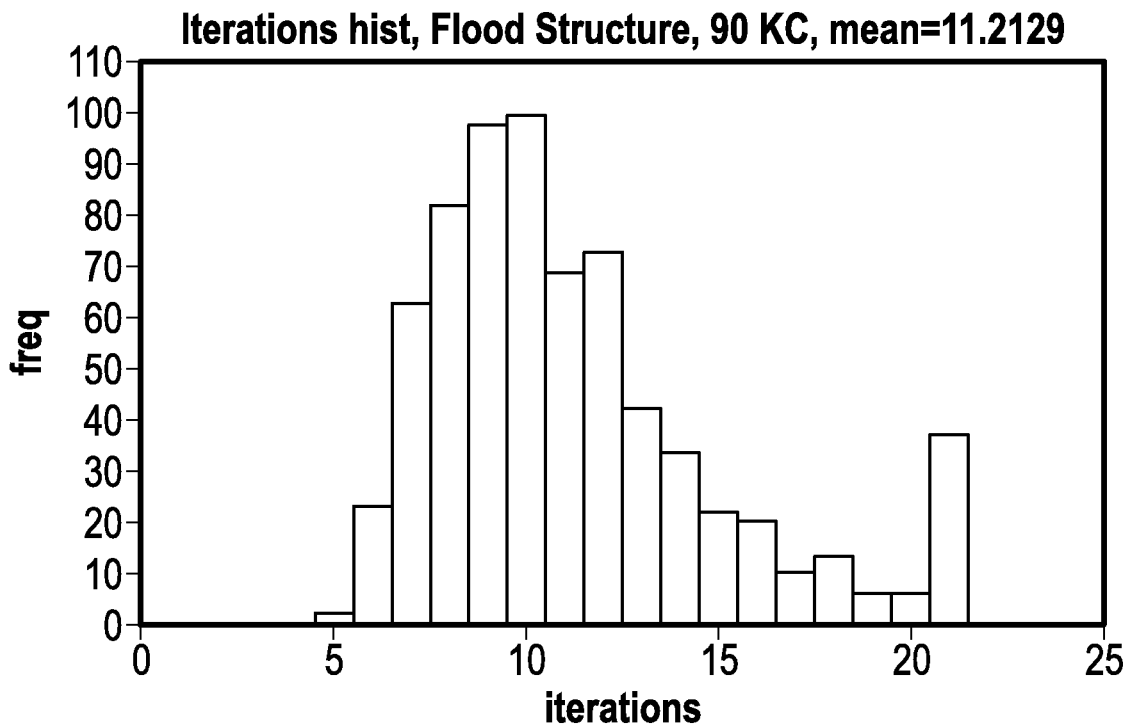
FIGS. 12A and 12B depict example iteration histograms for flooded MSM and layered MSM when a maximum number of iterations is limited to 20 iterations.
Figure 12B:
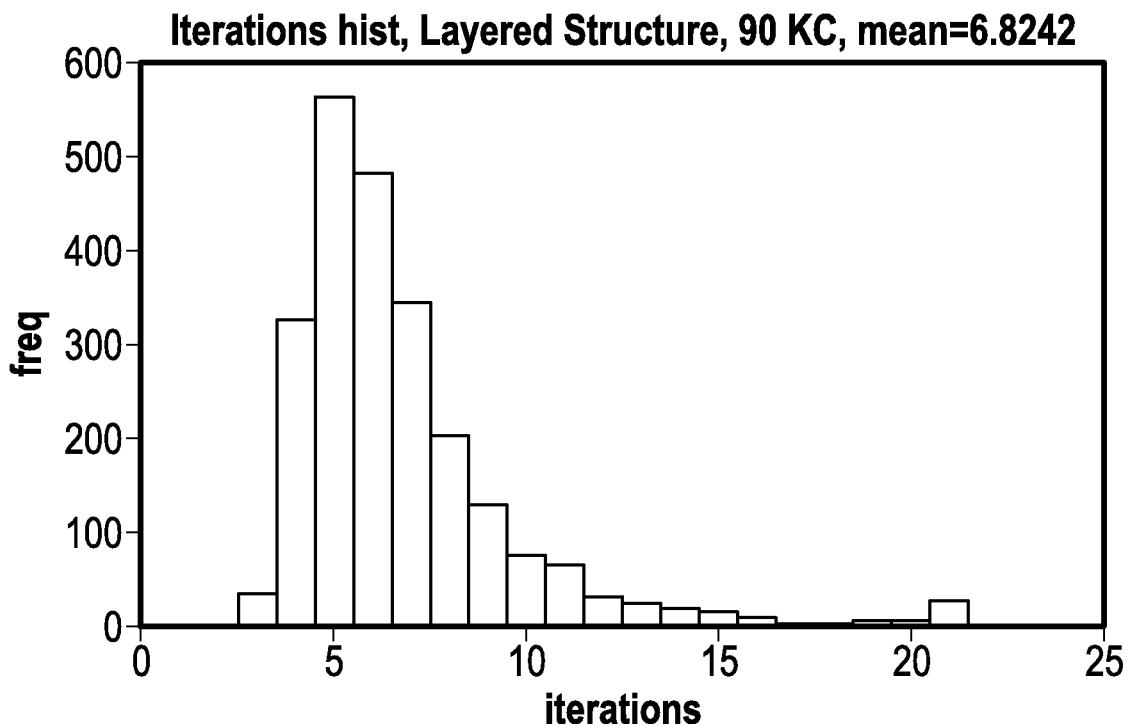

FIGS. 12A and 12B depict example iteration histograms for flooded MSM and layered MSM when a maximum number of iterations is limited to 20 iterations, according to one aspect of the subject technology. FIG. 12 compares the histograms of number of iterations when maximum iteration is set to 20 iterations. The example plots show that the average number of iterations is dropped from 11.2 iterations in flood MSM, to 6.8 iterations in layered MSM, while the error rate at such max iteration is more than 3 times better for layered MSM (see also FIG. 11).

MSM algorithm for non-binary LDPC decoding may significantly reduce the receiver complexity (memory and computation) compared to FFT based algorithms. The method may be extended to higher fields (GF-8, GF-16, etc.) with minor modifications. The simulation results for flood and layered decoding structures were presented, and the layered decoder structure is shown as providing faster convergence or additional gain in a limited number of iterations.

Figure 13:
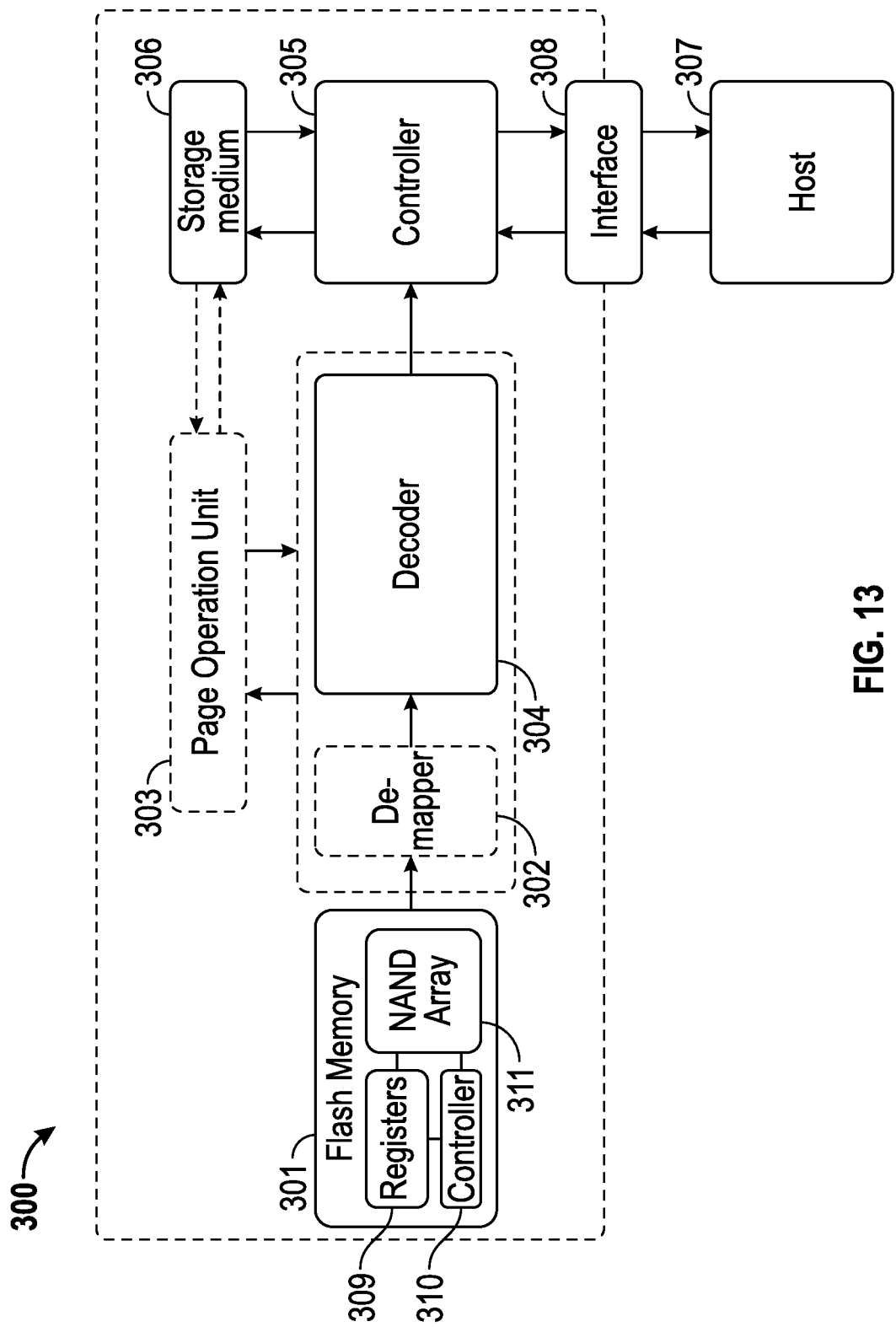
FIG. 13 is a block diagram illustrating components of a flash memory storage system, including a decoder.

FIG. 13 is a block diagram illustrating components of a flash memory storage system, including a decoder, according to one aspect of the subject technology. A flash memory storage system 300 (e.g., a solid state drive) may include a flash memory 301, a memory demapper 302 (a demodulator) and page operation unit 303, a decoder 304 (e.g., an ECC decoder), and a data storage controller 305. Page operation unit 303 and/or controller 305 may use a storage medium 306 for temporary storage of data and information. Demapper 302 may be used in page-based systems (and may be called a detector for level-based system like TCM) to modulate/demodulate bit mappings from flash memory 301 to other components of system 300. Demapper 302 is optional, and, when omitted, decoder 304 or page operation unit 303 may directly receive data from flash memory 301. Additionally or in the alternative, demapper 302 may be integrated with decoder 304. Page operation unit 303 may also be integrated with decoder 304 or other component of system 300. Decoder 304 may be used to decode the data before sending it to controller 305. Page operation unit 303 may be configured to perform a read operation on one or more cells of flash memory 301 (e.g., a page or block) and then assign a different log likelihood ratio for different error events.

The internal components (e.g., processor, internal memory, and the like) for demapper 302, page operation unit 303, decoder 304, and controller 305 are described herein for convenience as one device, with specific reference to decoder 304. However, one skilled in the art will recognize that these devices may be separate elements on their own PC boards, and each may include many similar internal hardware components. Accordingly, it is the intention that any one of these devices (e.g., page operation unit 303 and controller 305) may be described in a same or similar manner and/or perform the same or similar logic and/or functionality. For example, decoder 304, demapper 302, and/or page operation unit 303 may be responsible for determining and applying one or more of the previously described MSM algorithms. In some aspects, decoder 304 and demapper 302 may include similar functionality and may be referred to interchangeably in this disclosure.

Page operation unit 303 may include several internal components (not shown) such as a read-only memory, a flash component interface (e.g., a multiplexer to manage instruction and data transport along a serial connection to flash memory 301), an I/O interface, error correction circuitry, and the like. In some aspects, all of these internal elements of page operation unit 303 may be integrated into a single chip. In other aspects, these elements may be separated on their own PC board. Decoder 304 and/or page operation unit 303 may include a processor configured to execute code or instructions to perform the operations and functionality described herein, including implementing the previously described algorithms. In other aspects, a separate processor (e.g., a processor of controller 305) may be responsible for executing the same. In accordance with the disclosure, a processor may be configured to monitor and/or control the operation of the components in page operation unit 303. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within page operation unit 303 and/or its processor. One or more sequences of instructions may be software stored and read from a storage medium (e.g., storage medium 307), flash memory 301, or received from a host device (e.g., from host 307 via a host interface 308). ROM, storage medium 307, and flash memory 301 represent some examples of machine or computer readable media on which instructions/code executable by page operation unit 303 and/or its processor may be stored. Machine or computer readable media may generally refer to any medium or media used to provide instructions to page operation unit 303 and/or its processor, including volatile media, such as dynamic memory used for storage media 302 or for buffers within page operation unit 303, and non-volatile media, such as electronic media, optical media, and magnetic media.

In one aspect, controller 305 may be configured to store data received from a host device 307 in flash memory 301 in response to a write command from host device 307. Controller 305 may be further configured to read data stored in flash memory 301 and to transfer the read data to page operation unit 303 and then ultimately to host device 307 in response to a read command from host device 307. Host device 307 may represent any device configured to be coupled to data storage system 300 and configured to store data in system 300. Host device 307 may be a computing system such as a personal computer, a server, a workstation, a laptop computer, PDA, smart phone, and the like. Alternatively, host device 307 may be an electronic device such as a digital camera, a digital audio player, a digital video recorder, and the like.

Host interface 308 may be integrated with system 300 and configured to be operably coupled (e.g., by wired or wireless connection) to host device 307, to receive data from host device 307 and to send data to host device 307. Host interface 307 may include electrical and physical connections, or a wireless connection, for operably coupling host device 307 to controller 305 (e.g., via the I/O interface of controller 305). Host interface 308 may be configured to communicate data, addresses, and control signals between host device 307 and controller 305. Alternatively, the I/O interface of controller 305 may include and/or be combined with host interface 308. Host interface 308 may be configured to implement a standard interface, such as Serial-Attached SCSI (SAS), Fiber Channel interface, PCI Express (PCIe), SATA, USB, and the like. Host interface 308 may be configured to implement only one interface. Alternatively, host interface 308 (and/or the I/O interface of controller 305) may be configured to implement multiple interfaces, which may be individually selectable using a configuration parameter selected by a user or programmed at the time of assembly. Host interface 308 may include one or more buffers for buffering transmissions between host device 309 and controller 305.

In some aspects, storage medium 307 represents volatile memory used to temporarily store data and information used to manage data storage system 300. According to one aspect of the subject technology, storage medium 307 is random access memory (RAM) such as double data rate (DDR) RAM. Other types of RAM also may be used to implement storage medium 307. Memory 307 may be implemented using a single RAM module or multiple RAM modules. While storage medium 307 is depicted as being distinct from page operation unit 303 and controller 305, those skilled in the art will recognize that storage medium 307 may be incorporated into page operation unit 303 and/or controller 305 without departing from the scope of the subject technology. Alternatively, storage medium 307 may be a non-volatile memory such as a magnetic disk, flash memory, peripheral SSD, and the like.

Flash memory 301 represents a non-volatile memory device for storing data. According to one aspect of the subject technology, flash memory 301 includes, for example, a NAND flash memory. Flash memory 301 may include a single flash memory device or chip, or may include multiple flash memory devices or chips arranged in multiple channels. Flash memory 301 is not limited to any particular capacity or configuration. For example, the number of physical blocks, the number of physical pages per physical block, the number of sectors per physical page, and the size of the sectors may vary within the scope of the subject technology.

Flash memory may have a standard interface specification. This standard ensures that chips from multiple manufacturers can be used interchangeably (at least to a large degree). The interface hides the inner working of the flash and returns only internally detected bit values for data. In one aspect, the interface of flash memory 301 is used to access one or more internal registers 309 and an internal flash controller 310 for communication by external devices. In some aspects, registers 309 may include address, command, and/or data registers, which internally retrieve and output the necessary data to and from a NAND memory cell array 311. For example, a data register may include data to be stored in memory array 311, or data after a fetch from memory array 311, and may also be used for temporary data storage and/or act like a buffer. An address register may store the memory address from which data will be fetched to host 307 or the address to which data will be sent and stored. In some aspects, a command register is included to control parity, interrupt control, and the like. In some aspects, internal flash controller 310 is accessible via a control register to control the general behavior of flash memory 301. Internal flash controller 310 and/or the control registers 309 may control the number of stop bits, word length, receiver clock source, and may also control switching the addressing mode, paging control, coprocessor control, and the like.

In some aspects, registers 309 may also include a test register. The test register may be accessed by specific addresses and/or data combinations provided at the interface of flash memory 301 (e.g., by specialized software provided by the manufacturer to perform various tests on the internal components of the flash memory). In further aspects, the test register may be used to access and/or modify other internal registers, for example the command and/or control registers. In some aspects, test modes accessible via the test register may be used to read, input or modify certain programming conditions of flash memory 301 (e.g., determine read levels) to dynamically vary how data is read from the memory cells of memory arrays 311.

It should be understood that in all cases data may not always be the result of a command received from host 307 and/or returned to host 307. In some aspects, page operation unit 303 and/or controller 305 may be configured to execute a read operation independent of host 307. The predicate words "configured to", "operable to", and "programmed to" as used herein do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of example approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A machine-readable non-transitory storage medium having instructions stored thereon that, when executed, perform a method, comprising:
    providing a confidence vector at each of a plurality of variable nodes, each confidence vector associated with a portion of the codeword and comprising two or more vector components;
    at each variable node, selecting one of the vector components and passing the selected vector component to one or more of a plurality of check nodes;
    at each of the plurality of check nodes, calculating a return value for each variable node that passed a selected vector component to the check node, each respective return value calculated based on vector components received from variable nodes other than a variable node designated to receive the respective return value;
    receiving, at each variable node, a plurality of return values from the one or more check nodes; and
    updating, at each variable node, the confidence vector based on the plurality of return values to indicate one or more values assigned to the portion of the codeword.

2. The machine-readable non-transitory storage medium of claim 1, wherein passing the selected vector component to one or more of a plurality of check nodes comprises passing an index of the selected vector component to the one or more check nodes,
    wherein, at each check node, a return index is calculated for the return value based on indices received from the variable nodes other than the variable node designated to receive the return value,
    wherein, for each check node, the return index is returned with the return value to the designated variable node, and
    wherein, for each variable node, receiving the plurality of return values comprises receiving a return index for each return value.

3. The machine-readable non-transitory storage medium of claim 2, wherein updating the confidence vector comprises:
    adding each return value to the confidence vector at a corresponding return index.

4. The machine-readable non-transitory storage medium of claim 2, wherein the return index is calculated by summing the indices received from the other variable nodes using Galois field addition with a number of elements equal to the number of components in the confidence vector.

5. The machine-readable non-transitory storage medium of claim 1, wherein, for each check node, calculating each return value by summing the vector components received from the other variable nodes.

6. The machine-readable non-transitory storage medium of claim 1, the method further comprising:
calibrating the vector components of the confidence vector by reducing each of the vector components by an amount sufficient to zero a vector component value at a predetermined index of the confidence vector.

7. The machine-readable non-transitory storage medium of claim 1, wherein, for each check node, calculating the return value comprises selecting as the return value a largest one of the vector components received from the other variable nodes.

8. The machine-readable non-transitory storage medium of claim 1, wherein, for each check node, calculating the return value comprises selecting as the return value a smallest one of the vector components received from the other variable nodes.

9. The machine-readable non-transitory storage medium of claim 1, the method further comprising:
at each check node, calculating a first lowest value and a second lowest value from all vector components transmitted to the check node, wherein the first lowest value is selected as a return value for all but one of the variable nodes that transmitted a selected vector component to the check node, and the second lowest value is selected as a return value for the one of the variable nodes.

10. The machine-readable non-transitory storage medium of claim 1, wherein, for each check node, the return value represents a difference between the largest of the vector components received from all variable nodes and a vector component received from the variable node designated to receive the return value.

11. The machine-readable non-transitory storage medium of claim 1, wherein, for each variable node, the selected one of the vector components is a largest one of the two or more vector components of the confidence vector.

12. The machine-readable non-transitory storage medium of claim 1, wherein a number of vector components of the confidence vector is equal to a number of possible programming states of a memory cell configured to store one or more bits of a codeword.

13. The machine-readable non-transitory storage medium of claim 12, the method further comprising, for each variable node:
repeating the selecting, calculating, receiving, and updating steps until each component of the confidence vector converges to one of two predetermined levels; and
for each variable node, changing a current programming state of the codeword to a state corresponding to an index location of a primary component of the confidence vector if the index location of the primary component has changed as a result of the selecting, calculating, receiving, and updating steps.

14. A method, comprising:
receiving, at a first variable node, a confidence vector comprising a number of confidence vector components equal to a number of possible states of a memory cell, an index of a primary one of the confidence vector components being representative of a current state of the memory cell, the memory cell configured to store one or more bits of a codeword;
calculating, at a check node, a temporary vector component and corresponding component index for the first variable node based on other vector components and corresponding indices from one or more other variable nodes;
updating the confidence vector based on the temporary vector component and corresponding component index and other vector components and corresponding indices;
determining, at a variable node, whether the index of the primary one of the confidence vector components has changed as a result of one or more of the calculating and updating steps; and
if the index has changed, changing the current state of the memory cell in accordance with the updated index.

15. The method of claim 14, wherein the temporary vector component is calculated by summing the other vector components.

16. The method of claim 14, wherein the corresponding component index is calculated by summing the corresponding indices from one or more other variable nodes using Galois field addition with a number of elements equal to the number of vector components.

17. The method of claim 14, wherein calculating the temporary vector component comprises selecting as the temporary vector component a smallest one of the other vector components.

18. The method of claim 14, wherein calculating the temporary vector component comprises selecting as the temporary vector component a largest one of the other vector components.

19. The method of claim 14, wherein calculating the temporary vector component comprises determining a difference between the primary one of the starting vector components and a largest one of a group consisting of the primary one of the starting vector components and the other vector components.

20. A system, comprising:
a plurality of memory cells configured to store a codeword, each memory cell configured to store one or more bits of a codeword;
a decoder comprising decoding logic representative of a plurality of variable nodes operably connected to a plurality of check nodes in a graph configuration, each variable node associated with a corresponding memory cell, the decoder configured to:
receive, at a first variable node, a confidence vector comprising a number of vector components equal to a number of possible states of a respective memory cell, an initial index of a primary one of the vector components being representative of a current state of the respective memory cell;
transmit, from the first variable node to a first check node, the index of the primary vector component and a first value for the primary vector component;
receive, at the first check node, other vector component values and corresponding indices from one or more other variable nodes;
calculate a first return value and corresponding return index for the first variable node based on the other vector component values and corresponding indices;
return the first return value and corresponding return index to the first variable node;
update the confidence vector based on the first return value and corresponding return index and other return values and corresponding other indices received from other check nodes;
determine whether a component at the initial index is a primary component; and
on determining that the component at the initial index is not a primary component, change the current state of the respective memory cell in accordance with a new index of the primary component.

* * * * *